March 24, 1970 E. KUTSCHBACH 3,503,007

CONTROLLABLE OSCILLATOR

Filed Sept. 20, 1967

INVENTOR
ERNST KUTSCHBACH

United States Patent Office 3,503,007
Patented Mar. 24, 1970

3,503,007
CONTROLLABLE OSCILLATOR

Ernst Kutschbach, Karl-Marx-Stadt, Germany, assignor to VEB Buchungsmaschinenwerk Karl-Marx-Stadt, Karl-Marx-Stadt, Germany

Filed Sept. 20, 1967, Ser. No. 669,144
Int. Cl. H03b *5/24*
U.S. Cl. 331—117 5 Claims

ABSTRACT OF THE DISCLOSURE

An oscillator circuit for the use as a contactless proximity switch comprises a tapped tank circuit. A transistor oscillator is connected to said tank circuit and an adjustable resistor is connected between a tap on the tank circuit and ground to arbitrarily preset the onset of the oscillations which is turned off by the approach of an external damping member. The oscillator amplifier is coupled with a second amplifier into a flip-flop circuit which insures stable turned-off and turned-on conditions of the oscillator circuit.

BACKGROUND OF THE INVENTION

This invention relates to a controllable oscillator, and more particularly to an oscillator which is applicable as a contactless switch for detecting, especially in digitally operating devices, slowly running position changes and momentarily inoperative positions.

Contactless switches are already known which are employed as inductive proximity switches for reversing motion of sliding members of a machine tool, or as limit switches in measuring instruments.

These known proximity switches employ a weak feedback oscillator which, in the moment of approach of a metal piece near its coil, becomes damped or untuned so that the oscillations cease. Due to the failure of oscillations, the direct current which is taken by the oscillator changes abruptly, and this abrupt change is employed to control switching operations or, the alternating voltage of the oscillator may also be converted into a control signal by means of rectification.

The known switches operate with two or more tank circuits which are precisely tuned one to another and have the potential of affecting the feedback condition by changing the values of the circuit components. Notwithstanding, these switches are disadvantageous due to the need for employing a relatively large quantity of components.

Another known switch makes use of a transformer connected in the feedback circuit whereby the coupling coefficient of the transformer is varied according to an external action. This switch has the inherent drawback that the controlling element must be inserted into the slot in the position detecting device, that is the transformer. Consequently, an arrangement results which always must be provided with sufficient room on either side of the controlling member.

SUMMARY OF THE INVENTION

It is an object of this invention to provide a controllable oscillator which may be operated as a contactless switch.

Another object of this invention is to provide an oscillator employing a minimum quantity of components.

Still another object of this invention is to provide an oscillator which is applicable as a contactless switch for controlling switching operations in digitally operating devices.

In the oscillator according to the present invention, the feedback circuit comprises a tapped tank circuit having a resistor, whereby both ends of the tank circuit are coupled to the input and output of an amplifier, and a tap of said tank circuit is connected to one terminal of said resistor, the second terminal of which is connected to a common reference point of the amplifier's input and output.

Another novel feature of this invention is that an adjustable resistor is provided in the feedback circuit to vary the feedback, and also that the inductance of the tank circuit, forming a part of the feedback circuit, is damped by means of a mechanical member from which a function is derived.

In a further aspect of the present invention, the oscillator circuit is coupled to a second transistor to form a direct current saw-tooth generating circuit which is controlled by the rectified alternating voltage of the oscillator in such a manner that the collector current of the oscillator transistor increases when oscillations commence. Due to this action, a more stable feedback is provided for the existing oscillations, in contrast to the feedback which is available for exciting the oscillations.

BRIEF DESCRIPTION OF THE DRAWINGS

The invention will be more clearly understood from the following description of the specific embodiments of the invention, together with the accompanying drawings in which.

DESCRIPTION OF THE PREFERRED EMBODIMENT

The oscillator according to this invention and the mode of its operation will now be described first with respect to the FIG. 1.

The collector current of the transistor TS1 first produces a voltage drop between the taps 3 and 2 of inductor L1 of a tank circuit L1–C1 and also on seciton *b* of a variable resistor R1, the value of which has been firmly adjusted. For alternating current the center tap of R1 is connected to ground through a capacitor C4.

The feedback voltage thus derived is composed of a voltage between the coil sectors 1 and 2, and a voltage drop on section *b* of the variable resistor R1. Both voltages are phase shifted with respect to one another by 180°. As a consequence, the oscillations may start only in the event when the voltage, resulting across the transformation coupling sector of the coil L1, that is, across the coil sectors 1 and 2, is greater than the voltage drop across the section *b* of the resistor R1.

If the resonance impedance of the tank circuit is changed, the voltage drop across the coil L1 varies accordingly too and, moreover, a small oppositely directed voltage variation is developed across the resistor R1.

Due to the phase conditions, both voltage variations act upon the feedback voltage in the same direction so that even small variations of the resonance impedance result in a greater change of the feedback voltage. Therefore, the relative variation of the feedback voltage increases due to the fact that this voltage is composed of two component voltages. As a consequence, it acts as if in a bridge circuit. Simultaneously, the phase shift between the input (collector) and output (feedback) voltage is derived, which phase shift is necessary for the generation of the oscillations.

There is only one frequency determining member in the schematical diagram namely the tank circuit C1–L1. The generated frequency corresponds, therefore, always to the resonant frequency of the tank circuit so that only the resonant impedance of the tank circuit is to be considered. However, the magnitude of the resonant impedance depends upon the losses of the circuit components and it is possible to control the resonant impedance by means of externally damping the inductance L1, for example by positioning an electrically conductive member near the inductance.

The arrangement may be adjusted by an adjustable resistor R1 in order that the feedback voltage condition will be satisfied and the oscillations generated. In the case of an approach of an electrically conductive member toward the inductance L1, the losses increase and the resonance impedance of the tank circuit decreases. Consequently, the voltage drop on the winding of the tank circuit also decreases the feedback voltage so that the feedback condition is no longer fulfilled and the generation of oscillations ends.

Figure 1:
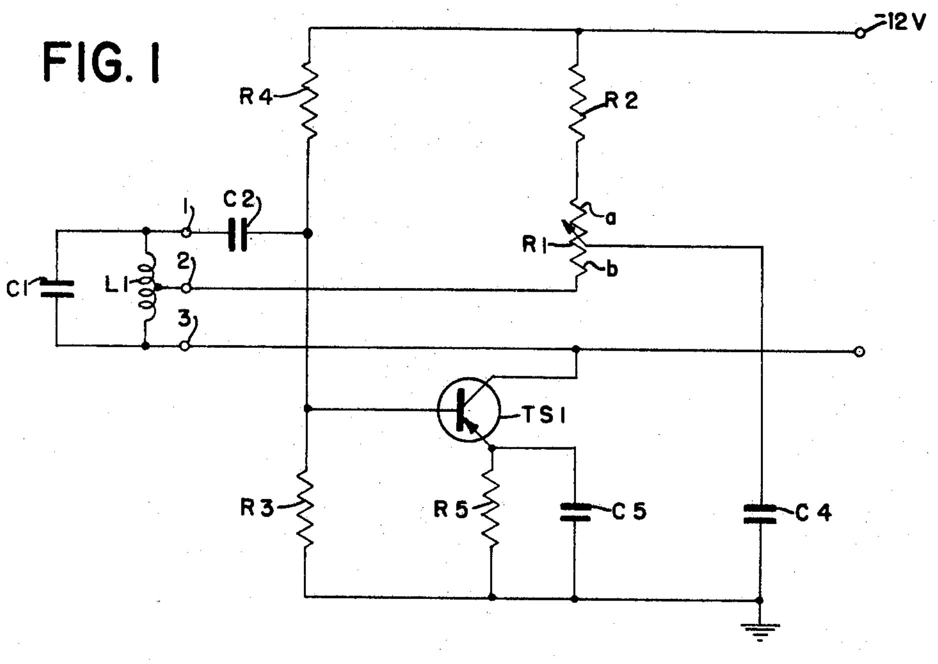
FIG. 1 shows a schematical diagram of an embodiment of the oscillator according to the invention.

Resistors R2, R3, R4 and R5 in FIG. 1 serve both for setting the operating point and for the stabilizing of the transistor TS1. Capacitor C5 is a by-pass capacitor for the emitter resistor R5 and capacitor C2 is a coupling capacitor for the tank circuit to the transistor input.

Figure 2:
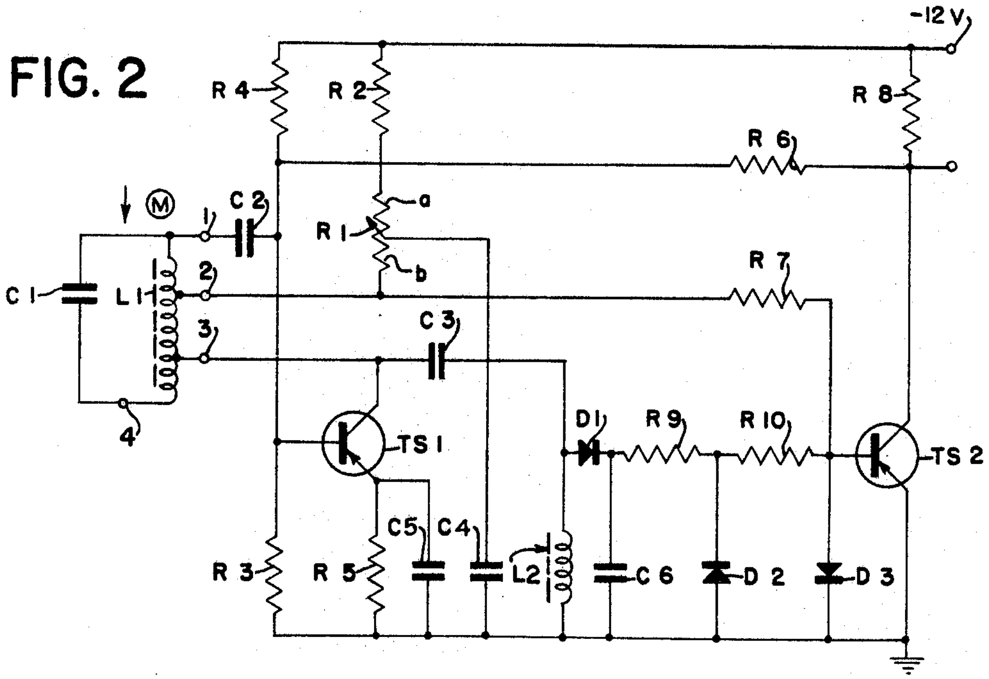
FIG. 2 shows a complete schematical diagram of the contactless switch.

In FIG. 2, a complete circuit is illustrated wherein the controllable oscillator operates as a proximity switch. The transistor TS1 cooperates with the tank circuit L1–C1, adjustable resistor R1 and with the remaining components for determining the operating point, in the same manner as described with reference to the circuit of above FIG. 1.

Besides, in cooperation with the circuit of transistor TS2 it operates as a bistable flip-flop stage. The operation of the circuit of FIG. 2 is as follows:

The inductance L1 is tapped at points 1, 2, 3 and 4 and in connection with capacitor C1 it represents a tank-circuit for the oscillator, as mentioned above. The resonance resistance of the tank circuit becomes damped when an electrically conductive element, such as a metal piece M approaches the inductance L1. Taps 2 and 3 serve for the adjustment of resonance resistance of the tank circuit to the values of remaining components, especially to the value of resistor R1. Tap 3 of the inductance L1 is connected with the collector of transistor TS1. The operating voltage for the collector of transistor TS1 is supplied via resistors R2, R1 and tap 2 of the inductance L1. The adjustable contact of resistor R1 is grounded through condenser C4. The feedback voltage is tapped at the tap 1 of the inductance L1 and applied through capacitor C2 to the base of transistor TS1. The feedback voltage is composed of the voltage which occurs across the inductance section between taps 1 and 2 and of the counteracting voltage produced across the section *b* of resistor R1 which has been adjusted by means of the movable tap. The operating point voltage is applied through voltage divider R4 and R3 to the base of transistor TS1. The emitter of TS1 is connected to ground through resistor R5 bridged by by-pass condenser C5.

The alternating voltage generated by the oscillator is picked up from the collector of transistor TS1 and applied via capacitor C3 to the anode of diode D1 at the input of the second stage of the flip-flop circuit The inductance L2 insures electrical connection to ground for the voltage rectified by the diode D1. Consequently, when the oscillator oscillates, there results a rectified positive voltage on the cathode of diode D1 and condenser C6 becomes positively charged. The positive charge of condenser C6 is applied through series connected resistors R9 and R10 to the base of transistor TS2. The diode D3 is connected in forward direction between the base of transistor TS2 and the ground. The emitter of TS2 is directly grounded. For a negative bias on the base of transistor TS2, the base-emitter path is turned on, whereas for a positive bias the diode D3 is conductive, so that resistors R9 and R10 are always loaded by the direct current from the charged condenser 6. The diode D2 is connected in reverse direction between the junction point of resistors R9 and R10 and the ground. When a negative bias is applied to the base of TS2, the diode D2 is conductive and a voltage drop occurs across the resistor R10. Consequently, only a very low portion of the negative voltage can arrive via the resistor R9 to the diode D1, so that the latter diode remains slightly conductive. For this reason, the diode D1 does not constitute any substantial load for the alternating voltage at the collector of transistor TS1 and, at the beginning of oscillations, the oscillator is substantially under the same load as during fully developed oscillations.

During the oscillating condition of the oscillator, as mentioned above, a positive voltage is applied through resistors R9 and R10 to the base of transistor TS2 and causes that TS2 is turned off. As a result, no voltage drop occurs across the collector resistor R8 connected between the collector of TS2 and the source of operating voltage, so that approximately a full operating voltage appears at the collector of TS2. Since the collector of TS2 is directly coupled via resistor R6 with the base of transistor TS1, the current flow in the transistor TS1 is subject to the conductive state of transistor TS2. The voltage across transistor TS1 becomes reduced when transistor TS2 is cut off and increased when TS2 is conductive. Resistor R7 which is connected between tap 2 of the inductance L1 and the base of TS2 couples the collector of TS1 with the base of TS2. Due to the direct resistance coupling between the transistors TS1 and TS2 by means of resistors R6, R7 and R8, a flip-flop circuit results in which the transistor TS1 is tiggered by a relatively low amount of voltage and the stability of the two switching states of TS1 is maintained due to the overload of transistor TS2.

In a state of equilibrium, the oscillator oscillates and produces by means of C3 and D1 a positive voltage on C6 which through resistors R9 and R10, cuts off transistor TS2. The increased collector voltage on TS2 is fed back to the base of transistor TS1, thus causing a change in the position of the operating point of TS1 and increases its collector current. The resulting reduced voltage at the collector of TS1 is applied via resistor R7 to the base of transistor TS2, by which action the present condition of the circuit is stabilized. At the same time, the increase of the collector current of TS1 causes an increase in the D.C. gain of the transistor so that also the operation of the oscillator becomes stabilized.

As shown in FIG. 2, if an electrically conductive element M approaches into the proximity of inductance L1, it will damp the resonance resistance of the tank circuit L1–C1. Consequently, the feedback voltage is decreased and the oscillations of the oscillator fail. As a result, no positive charge is accumulated at C6 and transistor TS2 becomes conductive. The base bias and thus the collector current of transistor TS1 is reduced due to the reduction of the collector voltage applied thereto via resistor R6 and the subsequently increased collector voltage at TS1 is applied via R7 to the base of TS2 so that transistor TS2 is turned on to its full saturation. The reduced collector current of TS1 causes a reduction in the D.C. gain of the latter transistor so that the cut-off condition of the oscillator becomes stabilized.

Provided that less rigorous requirements are put on the accuracy of switching points, the diodes D1 and D2 can be dropped out and the load resistance which the rectifier circuit provides for the oscillator circuit, will vary in broad limits. The fluctuation of the oscillator load may be caused at the one hand by different values of the oscillation amplitudes and, on the other hand, especially in case of the onset of the oscillations, by the voltage difference between the base and emitter of transistor TS2.

To compensate for the temperature dependence of the resonant impedance of the tank circuit, an additional resistor with a negative temperature coefficient may be provided between the tap 2 of the coil L1 and the common connection point of resistors R1 and R7.

According to the above described principles, a circuit has been described which, when using a −12 v. power supply voltage, produces an output signal of about −8.5 v. in the case of an oscillating oscillator, and of −0.5 v. in case of a non-oscillating oscillator. The measured accuracy of the switching point is approximately .2 mm. when the conductive controlling member is pased at a distance of 1 mm. around the core of the coil.

It is to be understood that the embodiments herein are shown merely for illustration and that the invention is not to be limited to these embodiments alone but rather to the claims appended below:

What is claimed is:

1. A controllable oscillator for contactless proximity switches comprising a tank circuit having two terminals and tapped inductance means, power supply means, first amplifier means having an input, an output and a reference point common both to said input and output, alternating current coupling means connecting one terminal of said tank circuit with said input said output being galvanically connected with the second terminal of said tank circuit, and an adjustable resistor means galvanically coupling a tap of said tank circuit to said power supply means, the adjustable tap of said adjustable resistor means being connected for alternating current to said reference point to selectively preset a feedback voltage for said circuit, thus adapting the same for being damped at the approach of a metal object.

2. The oscillator according to claim 1, further comprising second amplifier means having an input, an output and a common reference point; direct current coupling means interconnecting said first and second amplifier means for providing a flip-flop circuit operation therebetween; and coupling rectifier means connecting the output of said first amplifier with the input of said second amplifier in the manner that the oscillating condition of the first amplifier means causes a cut-off condition of the second one and a conductive condition of the second amplifier causes a stable non-oscillating condition of the first amplifier, said direct current coupling means comprising resistance means connected between said tap of the inductance and the input of the second amplifier means, and a second resistance means connected between the output of said second amplifier means and the input of said first amplifier.

3. The oscillator according to claim 2 wherein said first and second amplifier means comprise transistors having common emitter, base input, and collector output, respectively.

4. The oscillator according to claim 2 wherein said rectifier coupling means comprises resistance means and a rectifier element connected for loading said resistance means during cut-off condition of said second amplifier means.

5. The oscillator according to claim 3, wherein said rectifier coupling means comprises in series connected coupling condenser, first rectifier diode, first load resistor and a second load resistor; charging condenser connected between the common point of the first diode with the first load resistor and said reference point; said first rectifier diode being directed for cutting-off said second amplifier transistor when said oscillator transistor is in oscillating condition; a second rectifier diode connected between the common point of said first and second load resistors and said reference point; said second rectifier diode being connected in reverse direction with respect to said first diode; and a third rectifier diode connected in the direction of said first diode between the base of said second transistor amplifier and said reference point.

References Cited

UNITED STATES PATENTS

| | | | |
|---|---|---|---|
| 2,895,108 | 7/1959 | Haddad et al. | 324—41 |
| 2,807,720 | 9/1957 | Charles | 331—65 |
| 2,919,413 | 12/1959 | Charles | 331—65 |
| 3,147,408 | 9/1964 | Yamamoto et al. | 340—258 |
| 3,393,379 | 7/1968 | Sanford | 331—177 |

FOREIGN PATENTS

| | | |
|---|---|---|
| 1,168,757 | 12/1958 | France. |
| 298,172 | 11/1965 | Netherlands. |

OTHER REFERENCES

B. Donnally, "Simple Transistor Marginal Oscillator for Magnetic Resonance" in The Review of Scientific Instruments, vol. 31, No. 9 September 1960, pp. 977-978.

JOHN KOMINSKI, Primary Examiner

U.S. Cl. X.R.

324—3, 41; 331—65, 177; 340—258